(12) United States Patent
Mitchell

(10) Patent No.: US 9,839,158 B2
(45) Date of Patent: Dec. 5, 2017

(54) VAPOR CYCLE CONVECTIVE COOLING OF ELECTRONICS

(75) Inventor: Andre Mitchell, Rockford, IL (US)

(73) Assignee: HAMILTON SUNDSTRAND CORPORATION, Windsor Locks, CT (US)

( * ) Notice: Subject to any disclaimer, the term of this patent is extended or adjusted under 35 U.S.C. 154(b) by 279 days.

(21) Appl. No.: 13/418,461

(22) Filed: Mar. 13, 2012

(65) Prior Publication Data

US 2013/0239597 A1  Sep. 19, 2013

(51) Int. Cl.
| | |
|---|---|
| F25D 17/06 | (2006.01) |
| H05K 7/20 | (2006.01) |
| F25B 25/00 | (2006.01) |
| F25B 1/00 | (2006.01) |
| F25B 31/00 | (2006.01) |
| F25B 17/06 | (2006.01) |
| F25B 39/04 | (2006.01) |

(52) U.S. Cl.
CPC ........... *H05K 7/20254* (2013.01); *F25B 1/00* (2013.01); *F25B 25/005* (2013.01); *H05K 7/20318* (2013.01); *H05K 7/20354* (2013.01); *H05K 7/20509* (2013.01); *F25B 17/06* (2013.01); *F25B 31/006* (2013.01); *F25B 39/04* (2013.01)

(58) Field of Classification Search
CPC ........ F25D 17/06; F25B 31/006; F25B 39/04; F25B 25/005; H05K 7/20254; H05K 7/20318; H05K 7/20354; H05K 7/20509; H05K 7/20218; H05K 7/20381

USPC ................. 62/89, 259.2; 165/104.33–104.34
See application file for complete search history.

(56) References Cited

U.S. PATENT DOCUMENTS

| | | | | |
|---|---|---|---|---|
| 3,225,563 | A | * 12/1965 | Braun | F24F 13/224 62/277 |
| 3,289,750 | A | * 12/1966 | Valyi | F25B 39/04 165/110 |
| 6,795,311 | B2 | * 9/2004 | Pokharna et al. | 361/679.54 |
| 7,957,132 | B2 | * 6/2011 | Fried | 361/679.47 |
| 2003/0123223 | A1 | 7/2003 | Pokharna et al. | |
| 2007/0258216 | A1 | * 11/2007 | McBain | H05K 7/20154 361/707 |
| 2008/0259566 | A1 | 10/2008 | Fried | |

FOREIGN PATENT DOCUMENTS

| | | | |
|---|---|---|---|
| EP | 2068359 A1 | 10/2009 | |
| WO | WO 2010138664 A1 | * 12/2010 | ............... B60H 1/00 |

OTHER PUBLICATIONS

European Search Report and Communication; Aplication No. 13158785; dated Aug. 10, 2016; 12 pages.

* cited by examiner

*Primary Examiner* — David Teitelbaum
(74) *Attorney, Agent, or Firm* — Cantor Colburn LLP

(57) ABSTRACT

A cold plate device and method for cooling electronic systems is provided including a generally flat thermally conductive body having a cooling channel within the thermally conductive body. A first cooling fluid travels through the cooling channel to remove heat from the conductive body. A vapor compression cycle system is coupled to the thermally conductive body such that the first cooling fluid removes heat from a second cooling fluid in a portion of the vapor compression cycle system.

9 Claims, 4 Drawing Sheets

VAPOR CYCLE CONVECTIVE COOLING OF ELECTRONICS

BACKGROUND OF THE INVENTION

This invention relates generally to a system for heat transfer and more particularly, to the thermal management of an electronic system.

Electronic assemblies tend to generate varying levels of heat. If left unchecked, component overheating may affect performance or even cause failure of the electronic components. For relatively, low-power systems, air cooling and heat sink techniques often adequately maintain lower operating temperatures for electronic components. Applications that employ high power electronic components often require more effective methods such as liquid cooling. For example, high power electronic devices are commonly cooled through the use of a cold plate in thermal contact with the electronic devices. A cooling fluid circulates through the cold plate to draw heat away from the cold plate.

With the reduction in size of electronic devices, modern electronic systems have a greater quantity of electronic components within the same area as previous systems. This creates power dense electronic systems having an increased heat per unit volume output. Consequently, heat dissipation is an important design constraint and a need exists to cool these high powered electronic boxes efficiently. Additionally, loads on existing vehicle thermal management systems are growing due to retrofits of higher power electronic components and systems. By enabling the increase of coolant flow temperatures supplied by thermal management systems, existing cooling infrastructures are able to transport greater quantities of heat without significantly revamping the systems.

BRIEF DESCRIPTION OF THE INVENTION

According to one embodiment of the invention, a cold plate system is provided including a generally flat thermally conductive body. The body includes a cooling channel. A first cooling fluid travels through the cooling channel to remove heat from the conductive body. A vapor compression cycle system is coupled to the thermally conductive body. The first cooling fluid removes heat from a second cooling fluid in the condenser portion of the vapor compression cycle system.

According to another embodiment of the invention, a thermal management system for electronics is provided including a heat source. A cold plate has a generally flat thermally conductive body and a cooling channel within the thermally conductive body. A first cooling fluid passes through the cooling channel to remove heat from the conductive body. The cold plate is mechanically and thermally coupled to the heat source. A vapor compression cycle system is coupled to the cold plate to provide additional cooling to the heat source. The first cooling fluid of the cold plate removes heat from the second cooling fluid in a portion of the vapor compression cycle system. A heat dissipation device is fluidly connected to the cooling channel of the cold plate to form a cycle.

According to yet another embodiment of the invention, a method of cooling an electronics system is provided including conducting heat from a heat source to a cold plate. In addition, air cooled by a vapor cycle compression system is passed over the heat source, supplementing heat rejected to the cold plate by conduction. Cooling fluid travels through the cold plate cooling channel to remove heat from the conductive body via convection.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
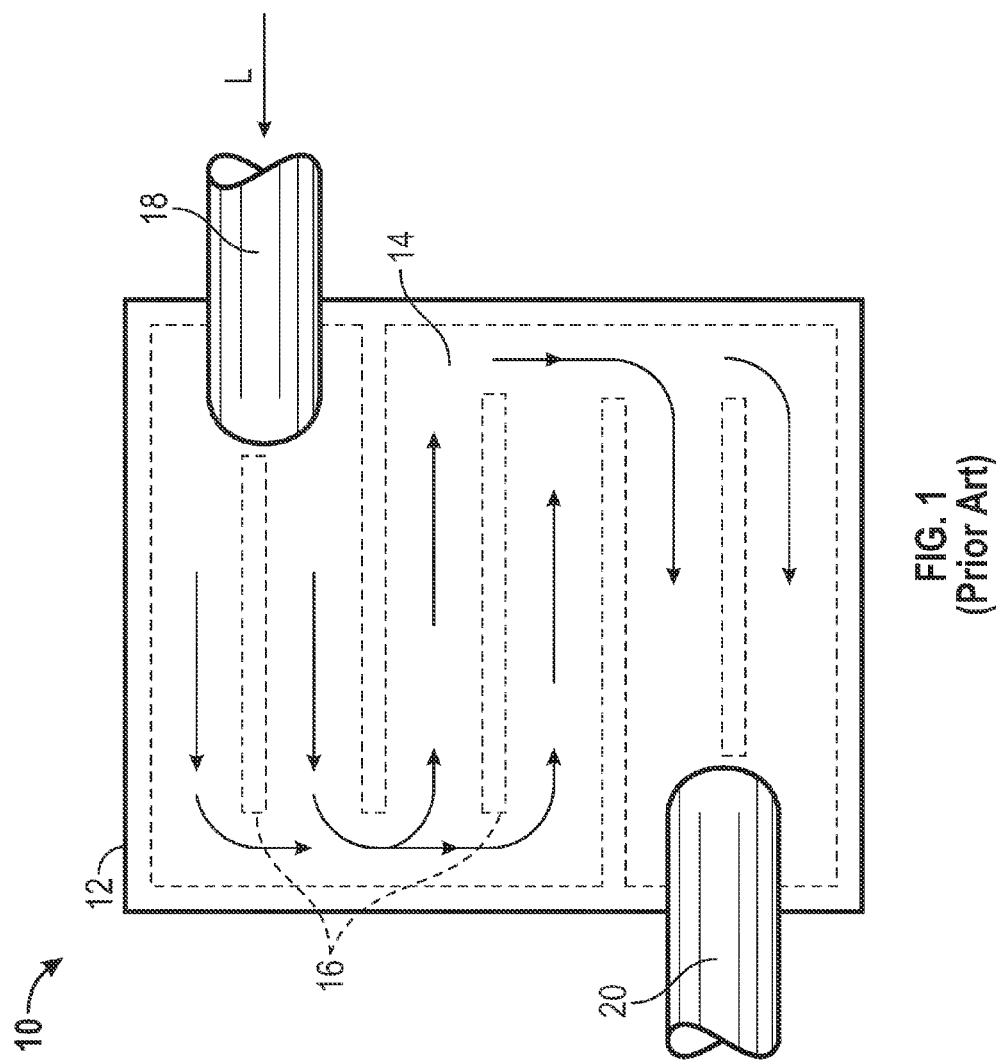
FIG. 1 is a top view of a conventional cold plate.

Referring now to FIG. 1, a conventional cold plate 10 used for cooling an electrical system is illustrated. As illustrated, the cold plate 10 includes a relatively flat thermally conductive body 12 formed with an engagement surface that closely mirrors the configuration of an electrical component. An internal cooling channel 14 is formed in the plate 10 by a plurality of fins 16 so that a cooling fluid L may circulate through the channel 14 to draw heat away from the cold plate 10 during operation. Cooling fluid L, such as a refrigerant, for example, is provided inside the channel of the cold plate 10 from a coolant supply. The cooling fluid L circulates through the cold plate by entering at a coolant inlet 18 and exiting through a coolant outlet 20.

Figure 2:
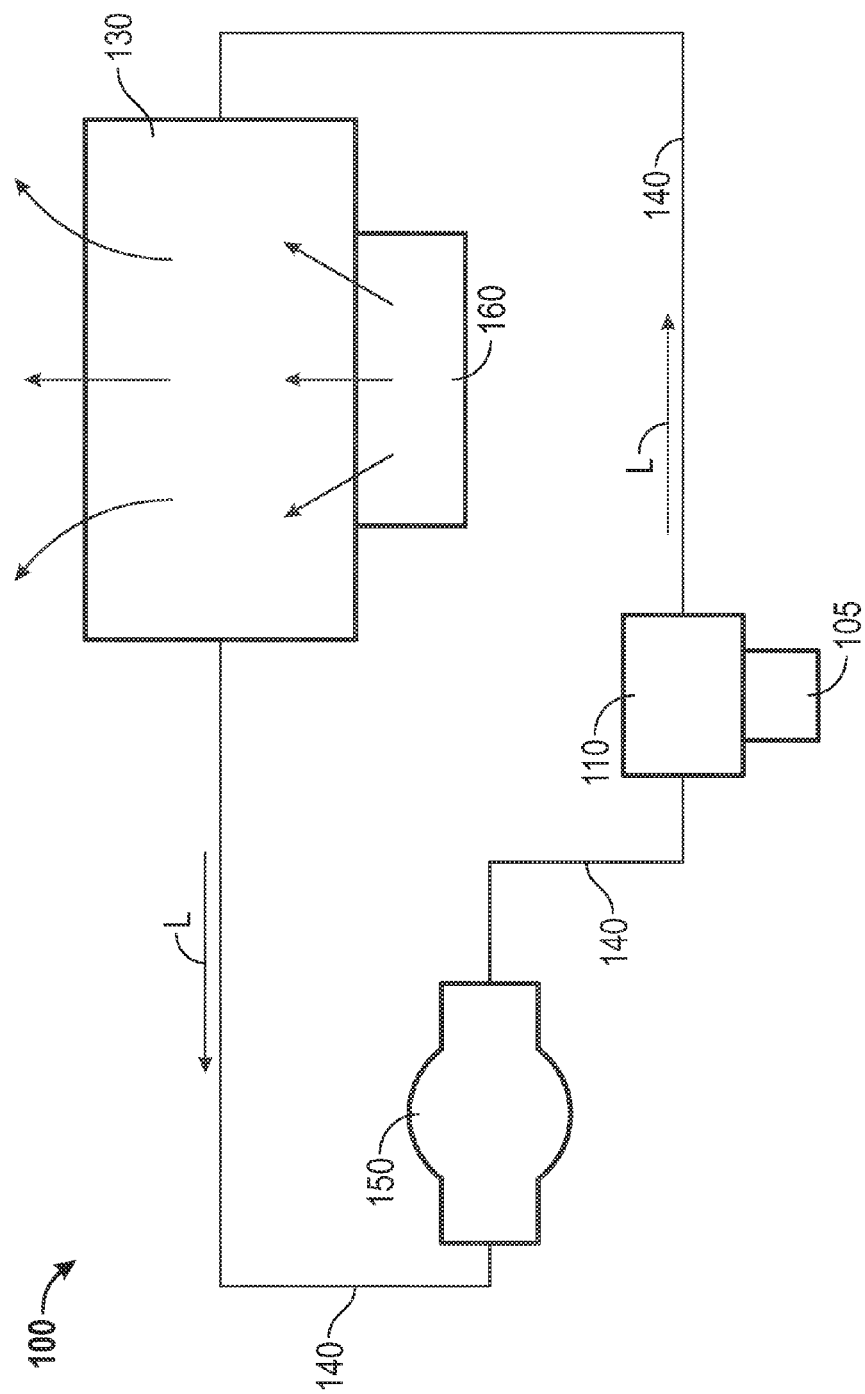
FIG. 2 is a schematic diagram of a liquid cooled electronics system.

With reference now to FIG. 2, a liquid cooled electrical system 100 includes a heat source 105, such as a processor or other electronic component, for example. A cold plate 110 is mechanically and thermally coupled to a surface of the heat source 105. It shall be understood that cold plate 110 can be formed in the same or a similar manner to cold plate 10 described above. The cold plate 110 is in liquid communication with a heat dissipation device 130, such as a heat exchanger, for example. Cooling fluid L is circulated through the cold plate 110 to the heat dissipation device 130 and back again through tubing 140 to provide a closed loop cooling cycle. A pump 150 may be included in the cycle between the heat dissipation device 130 and the cold plate 110 to circulate the cooling fluid L. Heat from the heat source 105 conducts through the mated surface to the cold plate 110. The heat then transfers to the cooling fluid L moving through the cold plate 110 by convection. In one embodiment, the electrical system 100 may also include a fan 160 to provide air flow for the heat dissipation device 130 and/or the cold plate 110.

Figure 3:
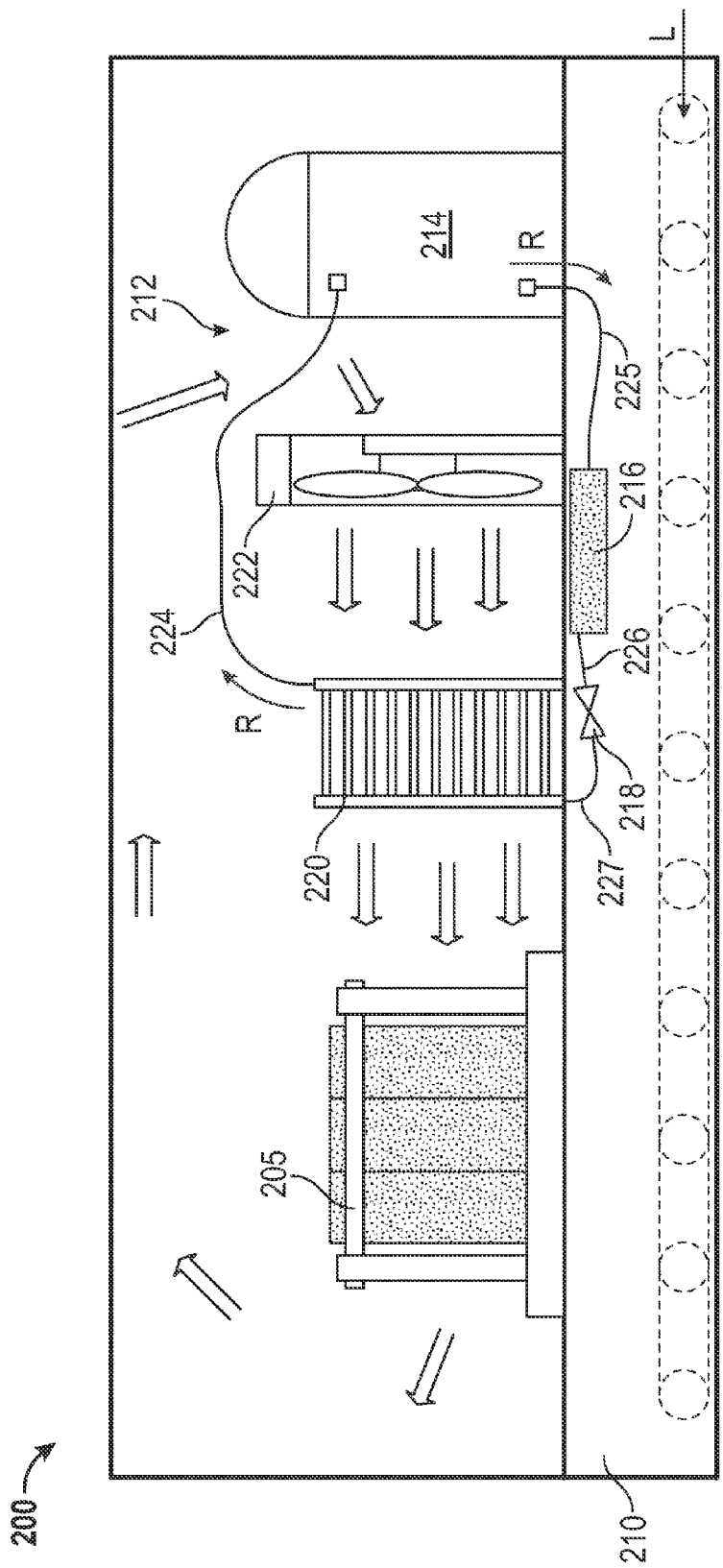
FIG. 3 is a side view of a cold plate system according to an embodiment of the invention.

Referring now to FIG. 3, a cold plate system 200 according to an embodiment of the invention is illustrated. A heat source 205 is mechanically and thermally coupled to a cold plate 210. The cold plate 210 is coupled to a vapor compression cycle system 212. In one embodiment, the heat source 205 and the vapor compression cycle 212 are enclosed. The vapor compression cycle system 212 includes a compressor 214, a condenser 216, an expansion valve 218, and an evaporator 220. In one embodiment, the evaporator 220 is positioned near the heat source 205. A fan 222 is disposed on the side of the evaporator 220 opposite the heat source 205, to blow air on to the evaporator 220 where it is cooled and then transmitted to the heat source 205. The evaporator 220 is fluidly connected to an inlet of the compressor 214 by a piece of tubing 224. The outlet of the compressor 214 is connected to the inlet of the condenser 216 by another piece of tubing 225. To complete the vapor compression cycle, an expansion valve 218 is coupled to both the condenser 216 and the evaporator 220 by additional tubing 226, 227.

In one embodiment of the invention, the vapor cycle system 212 may be coupled to the surface of the cold plate 210. For example, the condenser 216 may be located on the surface of the cold plate 210 adjacent the evaporator 220, the compressor 214 and the fan 222. In another embodiment, a portion of the vapor cycle system may be disposed within the cold plate 210. By locating a portion of the vapor cycle system 212 inside the cold plate 210, more space is available on the surface of the cold plate 210 for electronics. In one embodiment, the vapor channel of the condenser 216 may be located within the body of the cold plate 210, separate from but adjacent the cold plate 210 cooling channel. In such an embodiment, the first cooling fluid L flowing through the cooling channel of the cold plate 210 would draw heat away from the condenser 216, and the second cooling fluid R, circulating through the condenser 216 vapor channels. The vapor channels of the condenser 216 may extend over a portion of the length of the cold plate 210, or alternately, the vapor channels may 216 generally cover the full length of the cold plate 210. The length of the condenser 216 varies with each application. For example, the amount of heat to be dissipated from the heat source 205 and the desired temperature of the fluid exiting the condenser 216 will affect the size of the condenser 216. A longer vapor channel is required to cool the second cooling fluid R to a cooler temperature.

To remove heat from the heat source 205, the first cooling fluid L flows through the cooling channel of the cold plate 210 similar to a conventional cold plate 210. The vapor compression cycle system 212 operates concurrently with the cycling of the cold plate 210 cooling fluid L. The vapor compression cycle system 212 functions in accordance with conventional vapor compression cycles. Vapor of a second cooling fluid R enters the inlet of the compressor 214 through tubing 224. The compressor 214 increases the temperature of the vapor while maintaining a constant entropy, thereby resulting in a superheated vapor. This superheated vapor flows from the compressor 214 to the condenser 216 where it travels along the vapor channel. The condenser 216 removes heat from the vapor at a constant pressure and temperature causing the vapor to condense to a second cooling fluid R at a certain temperature. By integrating the vapor channel of the condenser 216 into the body of the cold plate 210, the first cooling fluid L flowing through the cold plate 210 cooling channel will draw additional heat away from the vapor in the vapor channel. The now liquid second cooling fluid R flows out of the condenser 216 to the expansion valve 218. The pressure of the expansion valve 218 causes flash evaporation and automatic refrigeration which creates a mixture of liquid and vapor at a lower temperature and pressure. This cool liquid and vapor mixture of the second cooling fluid R travels into the evaporator 220. The fan 222 blows air across the coils and tubes of the evaporator 220. The mixture completely vaporizes by removing the heat from the warm air that is being blown across the evaporator 220. The resultant vapor then travels through tubing 224 back to the inlet of the compressor 214 to complete the cycle.

Figure 4:
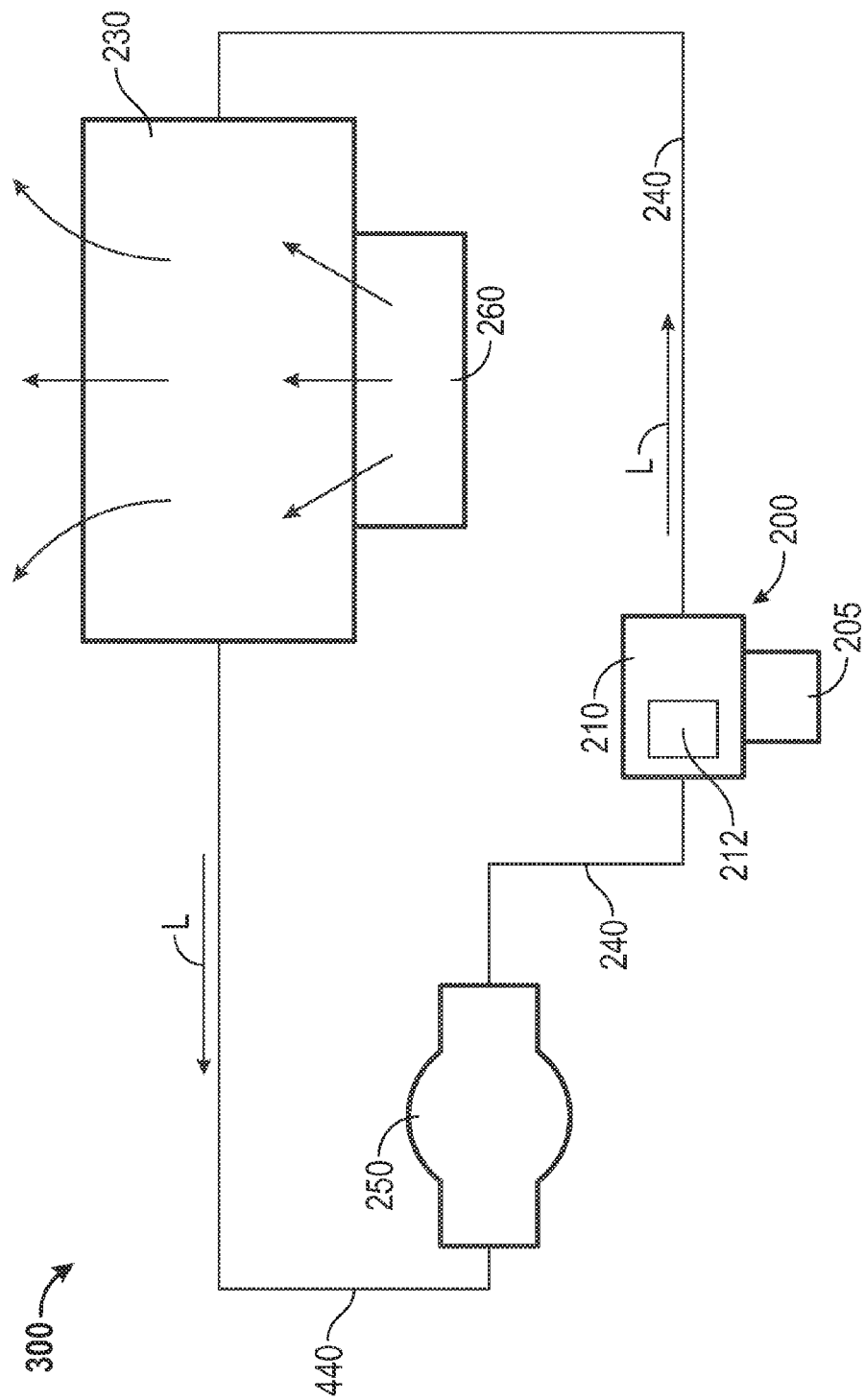
FIG. 4 is a schematic diagram of a liquid cooled electronics system according to an embodiment of the invention.

Referring now to FIG. 4, a liquid cooled electrical system 300 including the cold plate cooling system 200 is illustrated. The electrical system 300 includes a heat source 205, such as a processor or other electronic component, for example. The cold plate cooling system 200 includes a cold plate 210 and an integrated vapor compression cycle system 212 both mechanically and thermally coupled to the heat source 205. The cold plate 210 is in fluid communication with a heat dissipation device 230, such as a heat exchanger, for example which removes the heat absorbed in the cooling fluid L while travelling through the cooling channel of the cold plate 210. Cooling fluid L circulates from the cold plate 210 to the heat dissipation device 230 and back again. The liquid cooled electrical system 300 may include a pump 250 to circulate the cooling fluid L between the heat dissipation device 230 and the cold plate 210. Some of the heat from the heat source 205 conducts through the mated surface to the cold plate. Heat is then transferred to the cooling fluid L moving through the cold plate 210 by convection. Concurrently, the warm air surrounding the heat source 205 blows across an evaporator of the vapor compression cycle 212 thereby cooling the air adjacent the heat source.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A cold plate system comprising:
a flat thermally conductive body having an internal cooling channel integrally formed within the flat thermally conductive body through which a first cooling fluid travels to remove heat from the flat thermally conductive body; and
a vapor compression cycle system including:
a compressor located on an external surface of the flat thermally conductive body;
an evaporator in fluid communication with the compressor located on the external surface of the flat thermally conductive body;
a vapor channel through which a second cooling fluid, different than the first cooling fluid, travels between the compressor and the evaporator, the vapor channel formed within an interior of the flat thermally conductive body such the first cooling fluid is configured to remove heat directly from the second cooling fluid when the second cooling fluid is in vapor state, the vapor channel having a first channel end located at an external surface of the flat thermally conductive body and directly connected to the compressor at the external surface, and a second channel end located at the external surface and directly connected to the evaporator at the external surface; and
an expansion valve disposed within the flat thermally conductive body.

2. The cold plate system according to claim 1, wherein the vapor cycle system is coupled to a surface of the flat thermally conductive body.

3. The cold plate system according to claim 1, wherein the vapor channel is arranged in the interior of the thermally conductive body adjacent the cooling channel.

4. A thermal management system for electronics comprising:
- a heat source;
- a cold plate mechanically and thermally coupled to the heat source, the cold plate having a generally flat thermally conductive body and an internal cooling channel integrally formed within the flat thermally conductive body through which a first cooling fluid passes, the first cooling fluid being configured to remove heat from the flat thermally conductive body;
- a vapor cycle system including:
  - a compressor located on an external surface of the cold plate;
  - an evaporator in fluid communication with the compressor located on the external surface of the cold plate;
- a vapor channel through which a second cooling fluid, different than the first cooling fluid, travels between the compressor and the evaporator, the vapor channel is formed within an interior of the flat thermally conductive body such that the first cooling fluid is configured to remove heat directly from the second cooling fluid when the second cooling fluid is in vapor state, the vapor channel having a first channel end located at an external surface of the flat thermally conductive body and directly connected to the compressor at the external surface, and a second channel end located at the external surface and directly connected to the evaporator at the external surface; and
- an expansion valve disposed within the flat thermally conductive body; and
- a heat dissipation device fluidly connected to the cooling channel of the cold plate to form a cycle.

5. The thermal management system for electronics according to claim 4, wherein the vapor cycle system is coupled to a surface of the cold plate body.

6. The thermal management system for electronics according to claim 4, wherein the vapor cycle system includes a condenser and the vapor channel formed within the interior of the flat thermally conductive body is a portion of the condenser.

7. The thermal management system for electronics according to claim 6, wherein the vapor channel is arranged within the interior of the flat thermally conductive body adjacent the cooling channel.

8. The thermal management system for electronics according to claim 4, wherein the heat source is at least one electronic component.

9. The thermal management system for electronics according to claim 4, wherein the heat dissipation device is a heat exchanger for cooling the first cooling fluid.

\* \* \* \* \*